United States Patent [19]

Zahm et al.

[11] Patent Number: 4,713,601
[45] Date of Patent: Dec. 15, 1987

[54] POWER PROPORTIONING CONTROLLER FOR SOLID STATE RELAYS

[75] Inventors: Donald E. Zahm; Gary R. Strickler, both of Midland, Mich.

[73] Assignee: The Dow Chemical Company, Midland, Mich.

[21] Appl. No.: 33,842

[22] Filed: Apr. 3, 1987

Related U.S. Application Data

[63] Continuation of Ser. No. 780,537, Sep. 26, 1985, abandoned.

[51] Int. Cl.$^4$ .............................................. G05F 1/45
[52] U.S. Cl. .................................... 323/322; 323/324; 323/351
[58] Field of Search ............... 323/239, 241, 242, 300, 323/322, 323, 324, 326, 349, 351

[56] References Cited

U.S. PATENT DOCUMENTS

| | | | |
|---|---|---|---|
| 3,745,378 | 7/1973 | Pritchett | 307/252 B |
| 3,879,652 | 4/1975 | Billings | 323/322 |
| 3,979,654 | 9/1976 | Guicheteau et al. | 318/599 |
| 3,980,939 | 9/1976 | Greer | 318/599 |
| 3,990,000 | 11/1976 | Digneffe | 323/322 |
| 4,121,149 | 10/1978 | Seltzer | 323/323 |
| 4,129,791 | 12/1978 | Sato | 323/299 |
| 4,174,496 | 11/1979 | McFall et al. | 323/235 |
| 4,287,468 | 9/1981 | Sherman | 323/322 |
| 4,290,006 | 9/1981 | Wallace | 323/326 |
| 4,400,613 | 8/1983 | Popelish | 323/236 |
| 4,419,586 | 12/1983 | Phipps | 250/551 |
| 4,463,269 | 7/1984 | Yashima | 323/242 |

OTHER PUBLICATIONS

George Instrument Catalog "Solid State of the Art" Opto 22, 1979.
International Rectifier "Crydom" Product Digest 1982/83, Bulletin 3000F.
Douglas Randall, Div. of Kidde, Inc., "Solid State Proportional Controls" brochure 3-82 5M.

Primary Examiner—Patrick R. Salce
Assistant Examiner—Jeffrey Sterrett
Attorney, Agent, or Firm—Gregory A. Stobbs

[57] ABSTRACT

An economical astable multivibrator circuit provides a variable frequency, variable duty cycle digital signal for controlling a solid-state relay to provide power proportioning. An optical isolator receives analog input signals and converts those signals into a variable resistance signal for altering the RC time constant of the charge/discharge timing circuit. The controller is capable of driving several solid-state relays simultaneously and includes a powerstat adjustment for manually adjusting the range of power delivered to a load.

10 Claims, 2 Drawing Figures

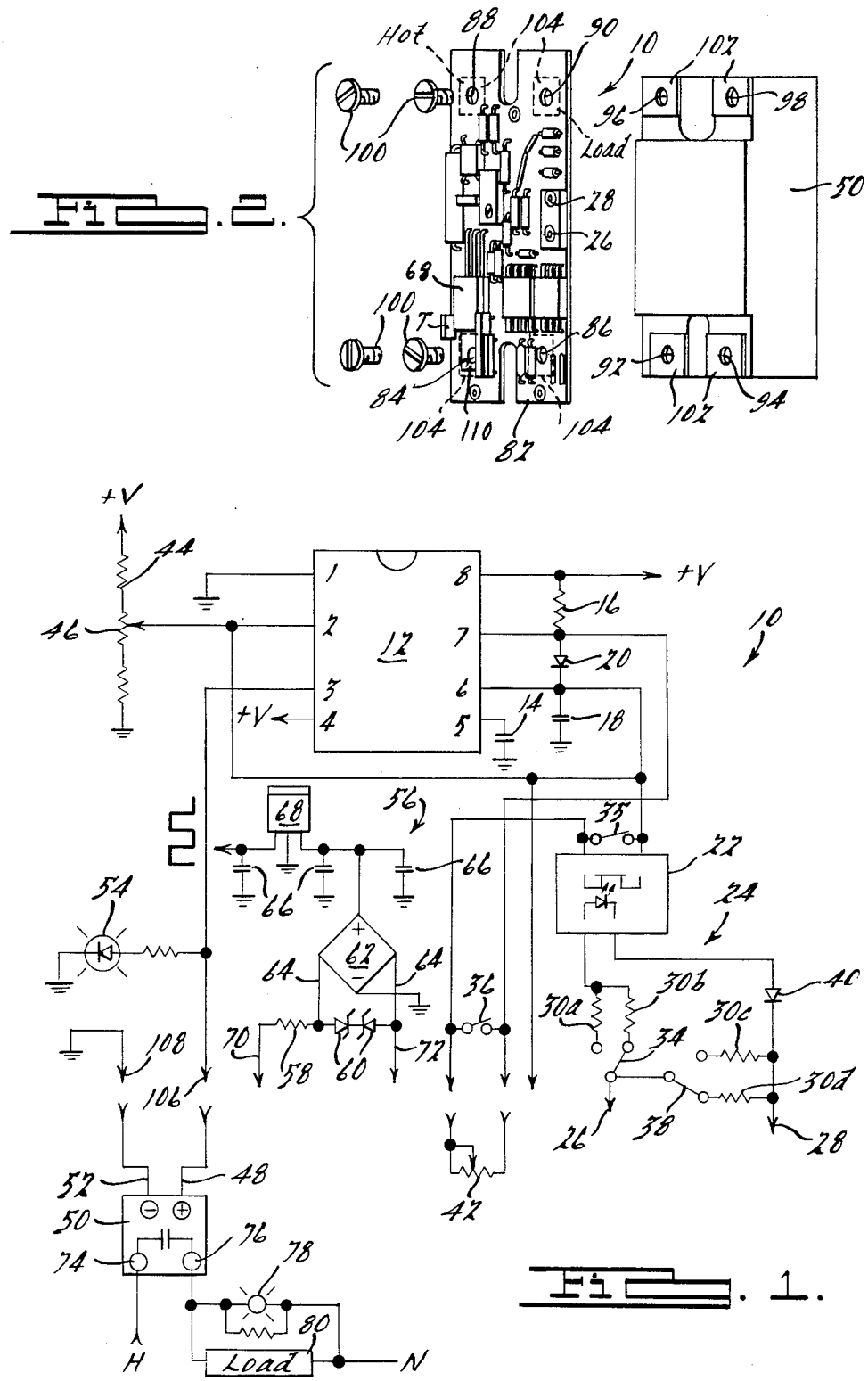

POWER PROPORTIONING CONTROLLER FOR SOLID STATE RELAYS

This is a continuation of U.S. patent application Ser. No. 780,537, filed Sept. 26, 1985, now abandoned.

BACKGROUND AND SUMMARY OF THE INVENTION

This invention relates generally to solid-state relays and relay controllers. More particularly, the invention relates to a solid-state relay controller for converting analog electrical signals into digital signals of a variable duty cycle proportional to the analog signal for directly energizing the solid-state relay to effect power proportioning control.

The solid-state relay is a relatively new electronic device for problem solving. It can handle large amounts of power, 40 amperes at 240 volts, for example. Many of today's solid-state relays are small, on the order of about $2'' \times 1\frac{1}{2}'' \times \frac{3}{4}''$, and can be turned on and off by a digital signal (on/off) signal at logic levels of between nominally 3 and 32 volts DC. Most solid-state relays are optically isolated and contain zero crossing firing circuits which cut down on radio frequency interference (RFI). Solid-state relays have been used in the past to turn pumps and heaters on and off, but by themselves lack the ability to regulate the quantity of power delivered to a load to effect power proportioning. Heretofore, it has not been possible to control solid-state relays using analog signals, such as of the type produced by instrumentation and control circuits, and by computer-controlled digital to analog converter circuits.

Circuits utilizing silicon controlled rectifiers (SCR) are known for controlling the power delivered to a load in response to analog signals. The conventional SCR-controlled light dimmer circuit is an example. Such circuits are commonly referred to as phase-fired circuits and operate by controlling the point on the input AC waveform where conduction begins to reguate the power delivered to the load. Typically these circuits are synced to the AC waveform.

Conventional dimmer-type circuits employing SCR's or the like are not often suitable in controlling heavy power consuming equipment particularly in the laboratory, where radio frequency interference can upset delicate experiments. High power phase-fired controllers of the conventional types require expensive, heavy-duty SCR's, and SCR circuits have traditionally been plagued with radio interference problems. Radio interference often results when the SCR device applies power to the load at or near the peak of the AC waveform. To minimize this interference, considerable effort is made to design circuits which switch near the zero crossing of the AC waveform. Often expensive RF filters and shielding must also be employed.

The present invention overcomes the above shortcomings of conventional phase-fired SCR circuits by providing a means for utilizing solid-state relays in a power proportioning mode never before realized. The invention is capable of controlling the power delivered to a high wattage load, such as single phase and multiphase high wattage heaters, in response to a wide range of different analog input signals. The invention is well adapted to providing power proportioning control in response to 0–10 V signals, 0–5 V signals, 4–20 mA signals and 10–50 mA signals. Thus, the invention is well adapted for computer control applications where a computer-controlled D to A converter provides the analog input signal for controlling a load in either open loop or closed loop operation. In addition, the invention is capable of being used in place of a conventional wire-wound variac, at a considerable weight savings, size savings and cost savings.

In accordance with the invention, a power proportioning controller is provided. The controller comprises a means for receiving an analog input signal, in the form of an optical isolator with selectible current scaling resistors. Also provided is a means for generating a variable duty cycle digital signal and a means responsive to the analog input signal receiving means for controlling the duty cycle of the digital signal in proportion to the analog input signal. A solid-state relay is energized by the variable duty cycle signal and the relay delivers proportioned power to a load based on the analog input signal.

Further in accordance with the invention, the components which comprise the power proportioning controller are disposed on a circuit board which bolts directly onto and establishes electrical connection with the terminals of the solid-state relay. The controller circuit further comprises a fully regulated AC to DC power supply circuit which derives all necessary power for operating the controller circuit directly from the power output terminals of the solid-state relay device. The resulting power proportioning controller is quite compact, the entire assembly being only slightly larger than the solid-state relay by itself. The controller circuit has remarkable fan out and is capable of controlling at least ten separate solid-state relays simultaneously. This gives the invention the ability to easily control all phases of a three-phase load simultaneously. The invention is further provided with a powerstat circuit which may be used to modify the sensitivity range of the controller to provide a convenient method for adjusting the range in which the load operates. In an electric heater, for example, the output of the heater can be readily adjusted to suit the heating load requirements by simply adjusting the powerstat circuit.

For a more complete understanding of the invention, its objects and advantages, reference may be had to the following specification and to the accompanying drawings.

BRIEF DESCRIPTION OF THE DRAWING

FIG. 1 is a schematic circuit diagram of the invention; and

FIG. 2 is a plan view of the power proportioning controller of the invention illustrating the preferred means for mounting the controller components directly on the terminals of a solid-state relay.

DESCRIPTION OF THE PREFERRED EMBODIMENT

Referring to FIG. 1, the power proportioning controller of the invention is illustrated generally at 10. At the heart of the controller is an astable multivibrator device 12. Multivibrator device 12 may be implemented using a 555 integrated circuit. In FIG. 1, the leads or terminals of multivibrator device 12 have been assigned the customary numbers for a 555 integrated circuit. Thus, it will be understood that lead 1 is ground; lead 2 is trigger; lead 3 is output; lead 4 is reset; lead 5 is optional FM input; lead 6 is threshold; lead 7 is discharge; and lead 8 is positive supply. As illustrated, a by-pass capacitor is coupled to lead 5, leads 1 and 8 are coupled to ground and the positive supply voltage, respectively, and lead 4, the reset terminal, is also connected to the positive supply. A first timing resistor 16 is coupled between leads 7 and 8, while timing capacitor 18 is coupled between lead 6 and ground. A diode 20 is coupled between leads 6 and 7 for reasons which will be explained below.

The controller circuit further comprises an optical isolator device 22, such as GE H11F2 U2. Coupled to the light emitting diode terminals of optical isolator 22 is a current scaling resistance network 24. Network 24 comprises a pair of input terminals 26 and 28 and a plurality of resistors 30a–30d which are selectively coupled to terminals 26 and 28 via jumpers 34, and 38. Jumper 34 may be installed to select either a 0–5 V range using resistor 30b or a 0–10 V range using resistor 30a (the 0–5 V range is illustrated in FIG. 1). Jumper 38 may be chosen to select a 10–50 mA range using resistor 30c or a 4–20 mA range using resistor 30d (the 4–20 mA range is shown in FIG. 1). Diode 40 is also provided between input terminal 28 and optical isolator 22 to restrict current flow to only one direction and thereby protect the optical isolator.

As illustrated, one of the output leads of optical isolator 22 is coupled to lead 6 of multivibrator device 12. The other output lead is coupled to a first terminal of powerstat potentiometer 42. The remaining lead of powerstat potentiometer 42 is in turn coupled to lead 7 of multivibrator device 12. Thus, optical isolator 22 is connected in series with powerstat potentiometer 42, and the series combination so connected is in turn connected in parallel across diode 20 and across leads 6 and 7 of multivibrator device 12.

A voltage divider network 44, which includes a zero adjust potentiometer 46, is connected to lead 2 of multivibrator 12 and also to lead 6 thereof. The output of multivibrator device 12 is connected to the positive control terminal 48 of solid-state relay 50. The negative control terminal 52 of solid-state relay 50 is grounded. To provide a convenient means for setting the zero adjust potentiometer to the proper setting, a light emitting diode 54 monitors the output lead 3 of multivibrator device 12. In setting the proper zero adjustment point, potentiometer 46 is adjusted with no input signal on input terminals 26 and 28 until light emitting diode 54 is extinguished. This in effect sets the solid-state relay 50 to the fully off state when no input signal is present.

A power supply 56 is provided for generating the positive supply voltages needed to power the multivibrator device 12 and the associated circuitry. Power supply 54 includes a power resistor 58, preferably of the wirewound variety, a pair of zener diodes 60, such as 1N4744, 15 VEA. A bridge rectifier 62 provides full wave rectification of the input AC power on AC power leads 64. The resultant DC voltage is filtered by filter capacitors 66 and the output is regulated using a solid-state regulator circuit 68. In the presently preferred embodiment, a 7805 regulator is employed to provide a fully regulated 5-volt positive supply.

Power supply 56 derives the necessary AC power via terminals 70 and 72. Terminals 70 and 72 couple directly to the output terminals or AC terminals 74 and 76 of solid-state relay 50. Preferably, terminal 70 is coupled to terminal 74, which is in turn connected to the hot side of the Ac load line, designated by the reference character H in FIG. 1. Terminal 72 is coupled to terminal 76, which is in turn coupled to the neutral side N of the AC load line. As illustrated in FIG. 1, a pilot lamp 78 may be connected across the load 80 to give an indication of when the load is energized. Pilot lamp 78 may be implemented using an incandescent or neon bulb. This has the advantage of providing a pilot indication which is less subject to flicker during power proportioning operation of the circuit.

The controller 10 of the invention may be used with a wide variety of different commercially available solid-state relays. Referring to FIG. 2, the controller 10 is assembled on a printed circuit board 82 which includes mounting holes 84, 86, 88 and 90. Mounting holes 84 through 90 are located so that they align with or register with the four solid-state relay mounting holes 92, 94, 96 and 98. Thus, the printed circuit board 82 may be secured directly to the top of solid-state relay 50 by passing bolts 100 through mounting holes 84–90 and securing them into relay mounting holes 92–98. In most cases, it is possible to use the existing terminal bolts found on the solid-state relay. Longer bolts may be substituted for the existing bolts to accommodate thick printed circuit boards if necessary.

As illustrated in FIG. 2, solid-state relay 50 is provided with four electrical contact plates 102 which threadedly receive solid-state relay mounting bolts 92–98. Printed circuit board 82 is provided with four foil lands 104 (shown in phantom) on the underside or foil side of the circuit board. Lands 104 make electrical contact with plates 102. With reference to FIG. 1, electrical contact plates 102 comprise the four electrical terminals of the solid-state relay 50, namely positive control terminal 48, negative control terminal 52, and Ac load line output terminals 74 and 76. In a similar fashion, the foil land 104, which aligns with the contact plate of output terminal 74 (hot), comprises the hot terminal 70 of power supply 56. To properly power the circuit, terminal 72 should be connected to neutral N via terminal strip T. Power may be alternatively supplied to the circuit through terminal strip T, instead of through the foil land 104 when controlling loads at voltages other than the voltage for which the circuit is designed. The contact between these respective plates and lands supplies the AC power needed to energize the controller circuit 10. The remaining two foil lands, which contact positive and negative control terminals 48 and 52, are electrically coupled to the output terminal 3 of multivibrator device 12 and to ground, as at connection points 106 and 108, respectively. As shown in FIG. 2, the heat sink tab 110 of regulator 68 is also coupled to the negative control terminal 52 (ground) by bolt 100. Bolt 100 not only supplies the electrical connection between the regulator and ground but also supplies a heat sink connection whereby heat generated by the regulator is conducted away for dissipation.

In operation, the current scaling resistor network 24 is configured with jumpers 34 and 38 to provide the desired analog input range. To select a 0–5 V range, jumper 34 is connected to resistor 30b and jumper 38 is disconnected. To select a 0–10 V range, jumper 34 is connected to resistor 30a and jumper 38 is disconnected. To select a 4–20 mA range, jumper 34 is connected to resistor 30b and jumper 38 is connected to resistor 30d. (This selection is illustrated in FIG. 1.) To select a 10–50 mA range, jumper 34 is connected to resistor 30b and jumper 38 is connected to resistor 30c.

In many cases, the load 80 is properly rated for the purpose intended and the controller may be used without powerstat potentiometer 42. In this case, jumper 36 is connected to short out or bridge the potentiometer terminals. If, on the other hand, the load is not properly rated for the use intended, it may be necessary to disconnect jumper 36, thereby connecting powerstat potentiometer 42 in the circuit in series with optical isolator 22 across terminals 6 and 7 of multivibrator device 12. When this is done, potentiometer 42 may be adjusted to set or calibrate the load to operate as desired. For example, if the solid-state relay is being used to control a heater for maintaining a water bath temperature or chemical process temperature, and if the heater being used is generally too hot when fully on, powerstat potentiometer 42 may be adjusted to reduce the heat output of the heater. Thus, even when the analog input signal on input terminals 26 and 28 calls for a fully on condition, powerstat potentiometer 42 will maintain the heater at less than full power output. This is a particularly useful feature for controlling chemical processes, particularly those which rely on closed loop feedback control systems using thermal sensors. By using the powerstat potentiometer to manually adjust the set point temperature, the control loop can be made more sensitive for more precise temperature control. In other words, the powerstat potentiometer serves as a rough temperature adjustment, with the analog input signal via optical isolator 22 providing the fine tuning.

In another mode of operation, the invention may be configured to behave as a substitute for a conventional wirewound variac. The variac is often used to adjust the AC line voltage where undervoltage or overvoltage is a problem. The variac emulating mode or powerstat mode is configured by connecting jumper 35, which shorts out the output of optical isolator 22. Jumper 36 is disconnected and jumpers 34 and 38 may be either connected or disconnected. In this mode, the powerstat potentiometer 42 supplies the only control signal to multivibrator device 12. In this mode, the power applied to load 80 is directly controlled by the setting of potentiometer 42. Although the voltage applied to the load via terminals 74 and 76 is dictated by the voltage across the hot and neutral terminals H and N, the circuit controls the power delivered to the load (the voltage-current product) to achieve a reduced power operating level. In contrast, a conventional variac would instead raise or lower the voltage applied across the load to thereby change the voltage-current product or power delivered. The invention provides the reduced power output by chopping the AC waveform in accordance with the output of multivibrator device 12.

The multivibrator 12 provides a digital signal, i.e. an on/off signal, which has a variable duty cycle and variable frequency. The duty cycle and frequency are proportional to the resistance applied between terminals 6 and 7 of the multivibrator, and the relationship of that variable resistance to timing resistor 16 and timing capacitor 18. The resistance across terminals 6 and 7 is controlled by powerstat potentiometer 42 (when connected) and also by optical isolator 22 (when connected). By increasing the voltage or current applied to the light emitting diode terminals of optical isolator 22, the effective resistance between the output terminals of isolator 22 decreases. Decreasing the resistance of isolator 22 shortens the charge time of capacitor 18. In practice, resistor 16 is on the order of twenty times smaller than the resistance of powerstat potentimeter 42. For example, resistor 16 may be a 43K ohm resistor and powerstat potentiometer may be a 1M ohm potentiometer. Multivibrator device 12 produces a variable duty cycle, variable frequency output signal on terminal 3 by alternatively charging and discharging capacitor 18 through resistor 16 and through the effective resistor (powerstat potentimeter 42 and optical isolator 22) across terminals 6 and 7. Diode 20 causes the charge and discharge times to be independent of one another.

To understand the operation of multivibrator device 12, assume that the output on terminal 3 is initially high (a logic 1 state). Capacitor 18 begins charging through resistor 16 until a threshold voltage is reached. Typically the threshold voltage is two-thirds of the positive supply voltage and is sensed by the threshold terminal 6. When this occurs, the multivibrator device changes state and the output on terminal 3 drops to zero (logical 0). Capacitor 18 then begins discharging through the resistance path provided by optical isolator 22 and by powerstat potentiometer 42. When the voltage on threshold terminal 6 drops to a predetermined low level, typically one-third the positive supply voltage, the multivibrator device 12 changes state again, returning to the high state (logic 1), whereupon the operation repeats. The output of multivibrator device 12 is, thus, switched on and off at a frequency determined by both resistor 16 and by the resistance path provided by powerstat potentiometer 42 and optical isolator 22. The on portion of each cycle is of a duration determined by the RC tire constant of resistor 16 and capacitor 18. The off portion of each cyle is of a duration determined by the RC time constant of the resistance path between leads 6 and 7 and capacitor 18. The frequency is the inverse of the complete cycle, that is, the inverse of the sum of the on time and the off time. By adjusting the effective resistance across terminals 6 and 7 to be low, the RC time constant during the off cycle can be reduced to practically zero. In this case, the output of multivibrator 12 is on practically 100 percent of the time and practically full power is delivered to load 80. When the resistance across terminals 6 and 7 is equal to the resistance of resistor 16, the charge and discharge rates are equal and a 50 percent duty cycle (square wave) output pulse train is applied to the solid-state relay. This chops or cycles the AC waveform on and off to deliver half power to the load. When the resistance across terminals 6 and 7 is increased to a value much larger than resistor 16, the discharge time becomes significantly longer than the charge time, and the output power delivered to load 80 can be reduced to a small fraction of full power.

By varying the analog input signal applied to terminals 26 and 28, the intensity of the light produced by the light emitting diode of optical isolator 22 is changed. This change is transmitted to the photocell portion of optical isolator 22 where it is converted to a resistance change. This resistance change is then used to control the RC time constant and, thus, control the duty cycle and frequency of the digital output waveform. In the presently preferred embodiment, the fully on analog input signal produces an output signal at nominally 200 Hz. The frequency varies to approach a fully off, 0 V DC signal when the analog input is at 0 volts. The circuit is essentially linear between the fully on and fully off extremes, hence, a 2.5 V DC analog input signal on the 0-5 V scale produces a 50 percent duty cycle for delivery of half power to the load.

The circuit of the invention is well adapted for use with a wide variety of different opto-coupled solid-state relays, including those manufactured by Crydom, Grigsby Barton, Hamlin, Magnetcraft and General Electric. The controller of the invention is compact enough to fit on a 2¼ by 3¼ circuit board with a standard 10 contact edge connector. The circuit is economical to produce, and a single circuit may be connected to more than one solid-state relay in order to accommodate one-, two-, and three-phase system. Optical isolation is provided between the analog input terminals and the AC load, thus, the circuit is well adapted for use with sensitive computer equipment. In addition to its use as a solid-state relay controller, the invention may also be used to provide a pulse train for actuating electric valves for controlling the percent of time the valves are open. By selecting the appropriate RC time constants, the repitition rate of the output signal can be changed from seconds to minutes.

While the invention has been described in its presently preferred embodiment, it will be understood that the invention is capable of modification and change without departing from the spirit of the invention as set forth in the appended claims.

What is claimed as novel is as follows:

1. A power proportioning controller comprising:
    means for receiving an analog input signal;
    an astable multivibrator means for generating a variable duty cycle digital signal, said multivibrator means including a capacitive means for alternately charging and discharging over predeterminable time intervals;
    optoelectronic variable resistance means having input terminals coupled to said input signal receiving means and having output terminals coupled to said capacitive means for controlling the duty cycle of said digital signal in proportion to said analog input signal by altering the relationship of said charging and discharging time intervals;
    solid state relay means energized by said variable duty cycle signal for delivering proportioned power to a load;
    manually adjustable potentiometer means coupled in series with said output terminals of said optoelectronic variable resistance means; and
    means for selectively shorting said output terminals of said optoelectronic variable resistance means and for selectively shorting said potentiometer means.

2. The controller of claim 1 wherein said input signal receiving means comprises current scaling means for selecting a predefined operating range.

3. The controller of claim 1 further comprising zero adjustment means including manually adjustable means for adjusting the duty cycle of said digital signal and indicator means responsive to said digital signal for indicating said adjustment.

4. The controller of claim 1 further comprising powerstat means coupled in series with said input signal receiving means for further controlling the duty cycle of said digital signal.

5. The controller of claim 1 further comprising a first time constant establishing means and a second time constant establishing means, said second time constant establishing means being responsive to said analog input signal; and
    wherein said astable multivibrator means is responsive to said first and second time constant establishing means for providing said variable duty cycle digital signal.

6. The controller of claim 1 further comprising manually adjustable means for controlling the duty cycle of said digital signal.

7. A power proportioning controller comprising:
    a solid-state relay device having a plurality of control terminals and further having a plurality of load terminals;
    a circuit board having apertures for receiving and mounting directly to said control terminals and said load terminals;
    a means disposed on said circuit board for receiving an analog input signal;
    an astable multivibrator means disposed on said circuit board for generating a variable duty cycle signal, said multivibrator means including capacitive means for alternately charging and discharging over predeterminable time intervals; and
    optoelectronic variable resistance means disposed on said circuit board and having input terminals coupled to said input signal receiving means and having output terminals coupled to said capacitive means for controlling the duty cycle of said digital signal in proportion to said analog input signal, said variable duty cycle generating means being coupled to said control terminals of said solid-state relay to thereby control said solid-state relay in accordance with said variable duty cycle signal;
    manually adjustable potentiometer means coupled in series with said output terminals of said optoelectronic variable resistance means; and
    means for selectively shorting said output terminals of said optoelectronic variable resistance means for selectively shorting said potentiometer means.

8. The controller of claim 7 further comprising power supply means disposed on said circuit board and receptive of alternating current from said load terminals of said solid-state relay, said power supply being coupled to said generating means to thereby energize said generating means.

9. The controller of claim 7 wherein said circuit board comprises a plurality of mounting holes in registration with said terminals of said solid-state relay.

10. A power proportioning controller comprising:
    a means for receiving an analog input signal including a plurality of scaling resistance means and means for interconnecting said resistance means in selected configurations;
    a signal isolation means having an input coupled to said resistance means and having an output for providing a variable resistance signal in response to said analog input signal;
    an astable multivibrator means having charging and discharging terminals and having at least one output terminal;
    resistive-capacitive means for establishing first and second time constants coupled to said charging and discharging terminals of said astable multivibrator means, said second time constant establishing means being coupled to said output of said signal isolation means;
    a solid-state relay means coupled to one of said output terminals of said multivibrator means for receiving said variable duty cycle signal, and solid-state relay means having a plurality of output terminals for connection to a source of electrical energy and a load to thereby control the power delivered to said load in accordance with said analog input signal; and
    manually adjustable potentiometer means coupled in series with the output of said signal isolation means for manually altering said variable resistance signal to thereby further control the power delivered to said load.

* * * * *

UNITED STATES PATENT AND TRADEMARK OFFICE
CERTIFICATE OF CORRECTION

PATENT NO. : 4,713,601
DATED : Dec. 15, 1987
INVENTOR(S) : Donald E. Zahm; Gary R. Strickler It is certified that error appears in the above-identified patent and that said Letters Patent is hereby corrected as shown below:

```
Col. 1, line 40, delete "reguate" and insert -- regulate --.
Col. 3, line 51, delete "54" and insert -- 56 --;
        line 65, delete "Ac" and insert -- AC --.
Col. 4, line 32, delete "Ac" and insert -- AC  --;

Col. 5, line 64, delete "potentimeter" and insert
                            -- potentiometer --.
Col. 6, line 3, delete "potentimeter" and insert
                            -- potentiometer --;
        line 26, delete "tire" and insert -- time --;
        line 27, delete "cyle" and insert -- cycle --.
Col. 7, line 5, delete "system" and insert -- systems --.
Col. 8, line 27, Claim 7, after "means" insert -- and --;
        line 58, Claim 10, after "signal," delete "and"
                            and insert -- said --.
```

Signed and Sealed this

Twenty-third Day of August, 1988

Attest:

DONALD J. QUIGG

Attesting Officer

Commissioner of Patents and Trademarks